United States Patent [19]
Parsonage

[11] Patent Number: 6,037,749
[45] Date of Patent: Mar. 14, 2000

[54] BATTERY MONITOR

[75] Inventor: Peter Cecil Joseph Parsonage, Beachlands, New Zealand

[73] Assignee: Batteryguard Limited, Auckland, New Zealand

[21] Appl. No.: 08/981,254

[22] PCT Filed: Jun. 20, 1996

[86] PCT No.: PCT/NZ96/00060

§ 371 Date: Dec. 22, 1997

§ 102(e) Date: Dec. 22, 1997

[87] PCT Pub. No.: WO97/01103

PCT Pub. Date: Jan. 9, 1997

[30] Foreign Application Priority Data

Jun. 21, 1995 [NZ] New Zealand ............................ 272408
Apr. 15, 1996 [NZ] New Zealand ............................ 286372

[51] Int. Cl.[7] ........................................................ H02F 7/00
[52] U.S. Cl. ............................................. 320/132; 324/427
[58] Field of Search ................................... 320/135, 136, 320/132; 361/92; 429/91; 340/636, 455; 307/10.7; 702/63; 324/427

[56] References Cited

U.S. PATENT DOCUMENTS

| | | | |
|---|---|---|---|
| 4,558,281 | 12/1985 | Codd et al. | ............................. 324/433 |
| 5,345,392 | 9/1994 | Mito et al. | ............................. 364/483 |
| 5,518,835 | 5/1996 | Simmonds | ................................ 429/90 |
| 5,726,553 | 3/1998 | Waugh | .................... 320/104 |

*Primary Examiner*—Peter S. Wong
*Assistant Examiner*—Gregory J. Toatley, Jr.
*Attorney, Agent, or Firm*—Young & Thompson

[57] ABSTRACT

A battery monitoring system includes a circuit for use with a battery which is one of a defined (quantified re volts supplied at known current loads at known discharge levels) type of battery such as the lead-acid batteries used in vehicles. Preferred embodiments monitor at least the battery voltage under load while measuring the drawn current and use stored numerical information in order to determine whether the battery has been discharged down to a predetermined limit; one which generally retains enough charge to perform a defined act such as starting an engine. If the battery is so depleted a non-critical load (e.g. accessories) is disconnected by a switch. Changes in the non-critical load are monitored and the non-critical load is reconnected for a predetermined period when a change is detected in order to start the engine.

10 Claims, 9 Drawing Sheets

BATTERY MONITOR

TECHNICAL FIELD OF THE INVENTION

This invention relates to a battery monitor. It has a capability for monitoring and displaying the state of charge in a battery and particularly has a capability for holding and then releasing at least some charge in a vehicle storage battery.

BACKGROUND

Many publications describe means to monitor the residual charge in batteries and in particular automotive batteries, where the amount of charge remaining may determine whether or not the battery can be used at a later time to drive a starter motor and effectively start an engine.

Also, a discharged lead-acid battery will deteriorate (known as sulfation) rapidly. There are many other applications of batteries where it is desirable to know the amount of residual charge in the battery, for example batteries used for cell phones, or for emergency equipment.

Although modern motor vehicle batteries have progressively improved in capacity there remains a risk that the battery can be accidentally discharged, for example, by leaving the lights on when leaving the vehicle or in other similar ways. Thus the driver on returning to the vehicle will not be able to start the engine because insufficient voltage or capacity remains in the battery to turn the starter motor or to provide sufficient power to the spark plugs, for example, to provide a usable spark. This can of course can be extremely inconvenient for the driver. In some situations, for example, in extreme weather conditions or in localities offering high personal risk a flat battery can be actually dangerous.

Some attempts have been made to overcome this problem, for example, by providing what are in effect double batteries or pairs of batteries but such arrangements may not solve the problem in all circumstances as an opportunity for the starting battery or for the vehicle starting cells to go flat, still remains.

Paredes (U.S. Pat. No. 4,020,414) is one of many inventions that uses battery voltage during discharge as a gauge of capacity, to warn the user of potential failure. These are in effect narrow-range voltmeters for the 11–12 V range, and assume use with a 12 V battery. Paredes uses an array of lamps as a voltage display. Paredes teaches (as in his FIG. 3) that there is a gradual decline of cell voltage as the level of charge is reduced. Stevens (U.S. Pat. No. 4,028,616) includes with his voltmeter a method for measuring voltage under no load and then after a ten-second engine start routine, in order to assess battery condition.

During research for this invention the problem of relying solely on voltage as per the above prior art was realised. It gives too inaccurate a cutoff point.

Sheldrake (U.S. Pat. No. 4,493,001) teaches a motor battery rundown protection system which does include disconnection and reconnection means but this system has only voltage sensing means. The same can be said for Sloan (U.S. Pat. Nos. 4,902,956 and 5,332,958).

DEFINITIONS

"A critical load" is a term used to refer to an important use of battery charge, such as for turning over an internal-combustion engine as part of an engine starting process.

"A non-critical load" is a term used to refer to a less important and possibly inadvertent use of battery charge, such as for running headlights, parking lights, or a radio.

"A defined type of battery" refers to a set of batteries having substantially similar voltage/current/state of charge characteristics, and for example refers in general to the class of conventional lead-acid storage batteries as are used in petrol or diesel-driven cars and similar road vehicles. (Some individual products may differ in characteristics from the majority; perhaps due to different details of design). Sealed, gel-electrolyte lead-acid storage batteries may comprise a different set, and nickel-cadmium rechargeable batteries are likely to comprise a different set.

OBJECT

It is an object of this invention to provide an improved means for monitoring a battery, or at least to provide the public with a useful choice.

STATEMENT OF THE INVENTION

In a first broad aspect the invention provides battery monitoring means for deriving an indication of the state of charge of a defined type of battery, the battery monitoring means comprising means capable of measuring the voltage of a battery of that type, means capable of measuring the current passing into or out of the battery, and evaluation means capable of determining the state of charge of the battery based on stored values of the relationship between measured voltage and current and the state of charge of that type of battery, the evaluation means being capable of controlling output means.

In a related aspect the invention provides battery monitoring means as described above, wherein the output means includes at least one switching means capable of connecting and disconnecting at least part of the load from the battery.

In another related aspect the invention provides battery monitoring means as described above, wherein the output means is capable of conveying information about the state of charge of the battery.

In a further related aspect the invention provides battery monitoring means as described above, wherein a load sensing means is capable of (a) monitoring the size of an electrical load connected to the battery and (b) causing the output means to reconnect the load to the battery if a change in the size of the load is detected by the load sensing means.

In a second broad aspect the invention provides battery monitoring means for deriving an indication of the state of charge of a defined type of battery, the battery monitoring means comprising battery condition sensing means, the battery condition sensing means comprising voltage sensing means capable of sensing the voltage supplied by the battery and current sensing means together capable of substantially simultaneously sensing the voltage and the current supplied by the said battery to a load, switching means capable of passing or blocking the connection between the battery and the load so isolating the load, load sensing means capable of sensing a change in the load, and evaluation means capable of evaluating the amount of charge held in that defined type of battery, so that should the amount of charge held in the battery be evaluated as being beneath a predetermined value, the evaluation means is capable of causing the switching means to disconnect part or all of the load from the battery for a period, so retaining a conserved charge in the battery, until the load sensing means detects a change in the load and causes the switching means to at least temporarily reconnect the load to the battery.

In a related aspect the invention provides battery monitoring means as described above, wherein the stored values for a type of battery comprise a set of scale and/or reference parameters for use in an analog computer.

In a further related aspect the invention provides battery monitoring means as described above, wherein the stored values for a type of battery comprise a set of constants for use in an algorithm capable of predicting the state of charge of a defined type of battery given voltage and current measurements.

In another related aspect the invention provides battery monitoring means as described above, wherein the stored values comprise at least one array of constants held within an addressable table, each constant representing the state of charge of a defined type of battery given a voltage measurement and a current measurement.

In yet another related aspect the invention provides battery monitoring means as described above, wherein means capable of measuring the ambient temperature and providing an output representing the ambient temperature are used to modify the evaluation process so that a greater reserve of charge is retained during colder weather.

In a further broad aspect the invention provides a vehicle having a battery connected to a load, battery monitoring means as previously described, and an isolating switch capable of being controlled by an output of the battery monitoring means thereby being capable of isolating one or more non-critical loads, wherein the battery monitoring means is capable of conserving at least some charge in the battery so that an engine in the vehicle can be started using that conserved charge (this being a critical load).

In yet another broad aspect the invention provides an electrically powered vehicle having a battery connected to a load, battery monitoring means as claimed herein, and an isolating switch capable of being controlled by an output of the battery monitoring means thereby being capable of isolating one or more non-critical loads, wherein the battery monitoring means is capable of conserving at least some charge in the battery so that the vehicle can be driven over at least a limited distance using the conserved charge.

In still another broad aspect the invention provides a battery including battery monitoring means, the battery having at least one positive and one negative terminal, the monitoring means allowing the battery to disconnect itself from a constant load in the event of the evaluation means within the battery monitoring means determining that the state of charge remaining in the battery has decreased below a predetermined level.

In a further broad aspect the invention provides a fixed installation including electricity generation means, storage battery means, and electrical distribution means, further including battery monitoring means as previously described, so that a reserve of electric power is retained in storage even if a constant load has inadvertently been connected to the battery.

In a related aspect the invention provides a fixed installation as claimed herein, wherein the battery monitoring means has an output capable of initiating a battery charging process, so that the battery is prevented from becoming too deeply discharged.

In a further broad aspect, the invention provides a battery monitor for a battery, the battery monitor comprising battery condition sensing means, the battery condition sensing means comprising voltage sensing means capable of sensing the voltage supplied by the battery and current sensing means together capable of substantially simultaneously sensing the voltage and the current supplied by the said battery to a load, switching means capable of passing or blocking the connection between the battery and the load so isolating the load, transient sensing means capable of sensing a change in the load, and evaluation means capable of evaluating the amount of charge held in the battery (according to the assumption that output voltage decreases with charge and with drawn current), so that should the amount of charge held in the battery be evaluated as being beneath a predetermined value, the evaluation means is capable of causing the switching means to disconnect part or all of the load from the battery for a period, so retaining a conserved charge in the battery, until the transient sensing means detects a change in the load and causes the switching means to reconnect the load to the battery.

Preferably the predetermined value comprises sufficient charge to permit the vehicle to be started with the usual electric starting motor.

Optionally, temperature measurement means capable of measuring the ambient temperature may be used to modify the value to be stored so that in colder weather more conserved charge is stored.

Optionally the battery monitor may create an electrical output capable of indicating the charge remaining in the battery upon a suitable display device.

Optionally the battery monitor may be capable of detecting the presence of an inferior, aged, or otherwise faulty battery and may be capable of producing a warning signal when such a battery is detected.

Additionally the battery monitor may be capable of raising the amount of conserved charge in the event of detecting an inferior, aged, or otherwise faulty battery.

Preferably the evaluation means is a device based on numerical processing means, and preferably it evaluates the battery charge remaining by means of an algorithm including constants relevant to the type of battery to be monitored.

Alternatively the evaluation means may use a stored table of constants which are relevant to the type of battery to be monitored.

Preferably the numerical processing means is a digital computer such as a microprocessor.

Preferably the evaluation means includes time delays and the like so that its evaluation, once made, is stable.

Preferably the voltage sensing means comprises an operational amplifier connected across the battery or across a voltage divider which in turn is connected across the battery.

Preferably the current sensing means comprises an operational amplifier connected across a resistance in series with the load.

Preferably the transient sensing means comprises an operational amplifier connected as a differentiator, connected across the load, and a bleed resistor connected across the switching means, the bleed resistor being capable of admitting a small current to the load so that when the load changes in magnitude, a change in load voltage is detected as a pulse suitable for use as a signal.

Preferably the switching means comprises a solid state switch.

Optionally the solid state switch may include current sensing means.

Preferably the load will include all parts of the electrical circuit of a vehicle apart from the battery; including the starter motor circuit, the charging alternator, lights, and other accessories, so that the solid state switch is capable of disconnecting all loads in the vehicle.

Optionally the starter motor circuit may remain connected to the battery at all times.

Optionally the battery monitor may be built inside the battery during manufacture.

Alternatively the battery monitor may be built into a vehicle during manufacture.

Alternatively the battery monitor may be incorporated in a control system (such as a control and management microcomputer) for a vehicle during manufacture.

Alternatively the battery monitor may be supplied as an accessory for installation in a vehicle after manufacture.

Alternatively the battery monitor may be used in an energy storage system such as a solar-powered system or a wind-powered system.

PREFERRED EMBODIMENT

These and other aspects of this invention, which should be considered in all its novel aspects, will become apparent from the following description, which is given by way of example only, with reference to the accompanying drawings, in which:

FIG. 3B is a second graph of battery voltage versus % Charge Remaining for a lead-acid battery.

FIG. 3C is a graph of internal resistance versus % Charge Remaining.

Introduction

A preferred form of the device has as one function that of conserving charge in a battery so that a critical application is still capable of being carried out at a later time; possibly at the expense of non-critical use. The battery is isolated by a series switch if the battery charge drops below a predetermined level (such as half-full, or 20 AH remaining in the battery). A specific example of a critical application is to leave enough Ampere-hours (Ah) so that a car engine can still be started, under conditions such as possibly inadvertent steady drain by various accessories such as lights; for a battery of some indeterminate age and hence total capacity. I prefer to retain a charge of about 20 Ah for starting the car. Because batteries have a finite and rather short life of typically two to five years, during which time the capacity drops, I prefer to be conservative in relation to the size of the retained charge.

Figure 7:
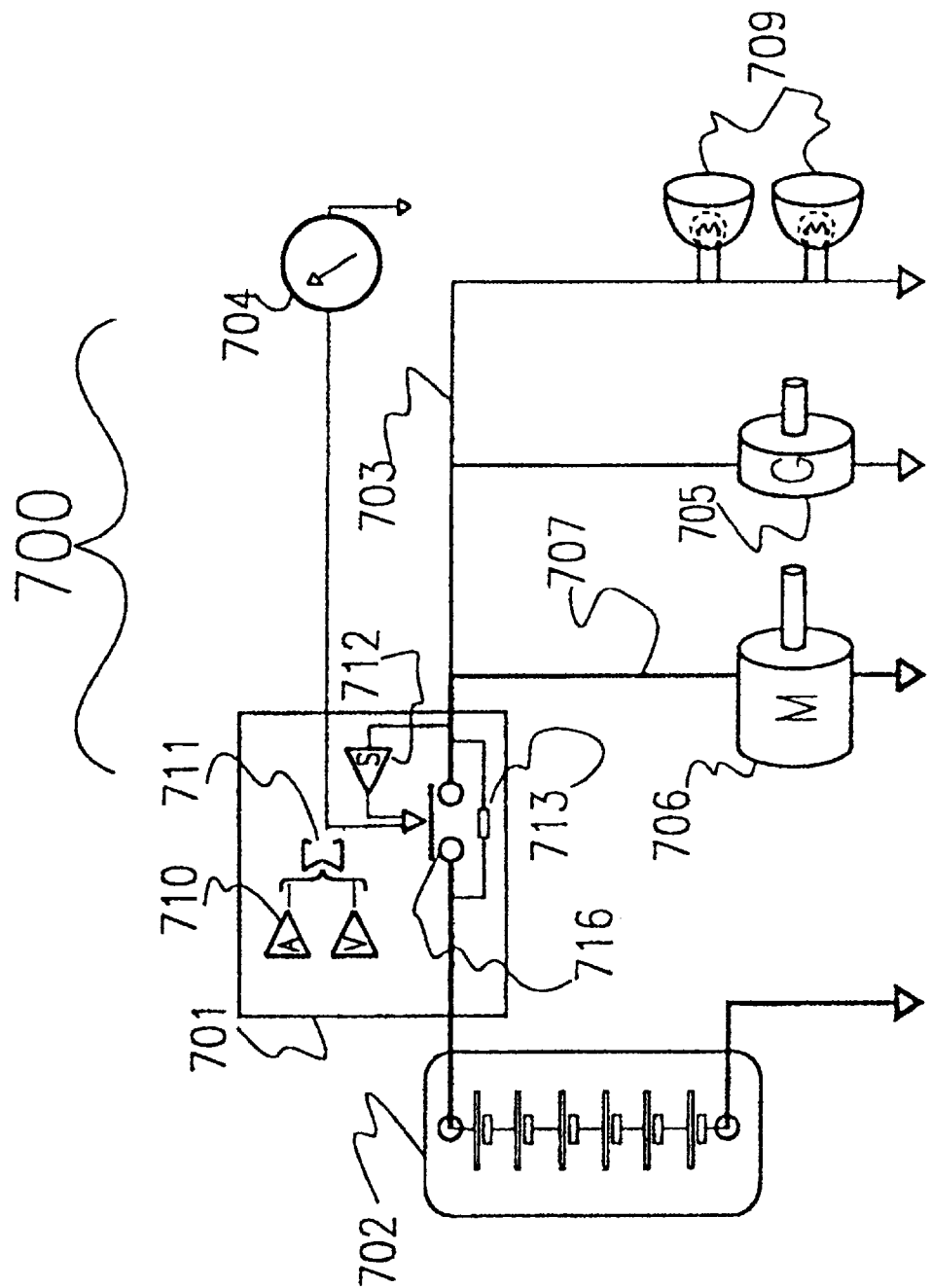
FIG. 7 is an overall block diagram of a system for an internal-combustion engine car, or an electric car, or even an alternative power system.

A preferred form of the device is intended to automatically reconnect the battery and restore normal electrical power as soon as it senses that a critical demand is imminent, such as when a person returns to his or her car and operates the ignition/starter switch. The series switch is preferably is placed in series with the lighting, charging, and accessories circuit from the battery, not in series with the starter motor itself. (Note that improvements in solid-state switches, by providing sufficient capacity at a reasonable price, do allow the invention to also be wired in series with the starter motor, and FIG. 7 illustrates this).

Several properties of batteries; whether rechargeable storage batteries (secondary cells) or primary cells can be measured electrically. These include the cell voltage under loads ranging from zero to a high level, and calculations can provide further data such as internal resistance.

That the cell voltage drops gradually during discharge is known (see Paredes, cited above). This is likely to be a function of the concentration of sulphuric acid which is the electrolyte in the vicinity of the plates, and the chemical composition of the plates, and the degree of sulfation. I have found that reliance on cell voltage alone—as described in the prior art—is insufficiently accurate for the ultimate goal of conserving a known amount of charge within a battery, because other factors, principally the rate of current drain, also have an effect. Surprisingly I have discovered that taking into account those other factors such as those dependent on load current allows an improved prediction of the state of charge of the battery over simply measuring the voltage across the battery terminals as is done in the prior art. The voltage droop under load is generally described as the internal resistance of a battery.

Thus preferred forms of this device includes means to measure battery voltage during a load, and hence measure the load—the actual current delivered at the time of measurement as well.

Figures 3A, 4:
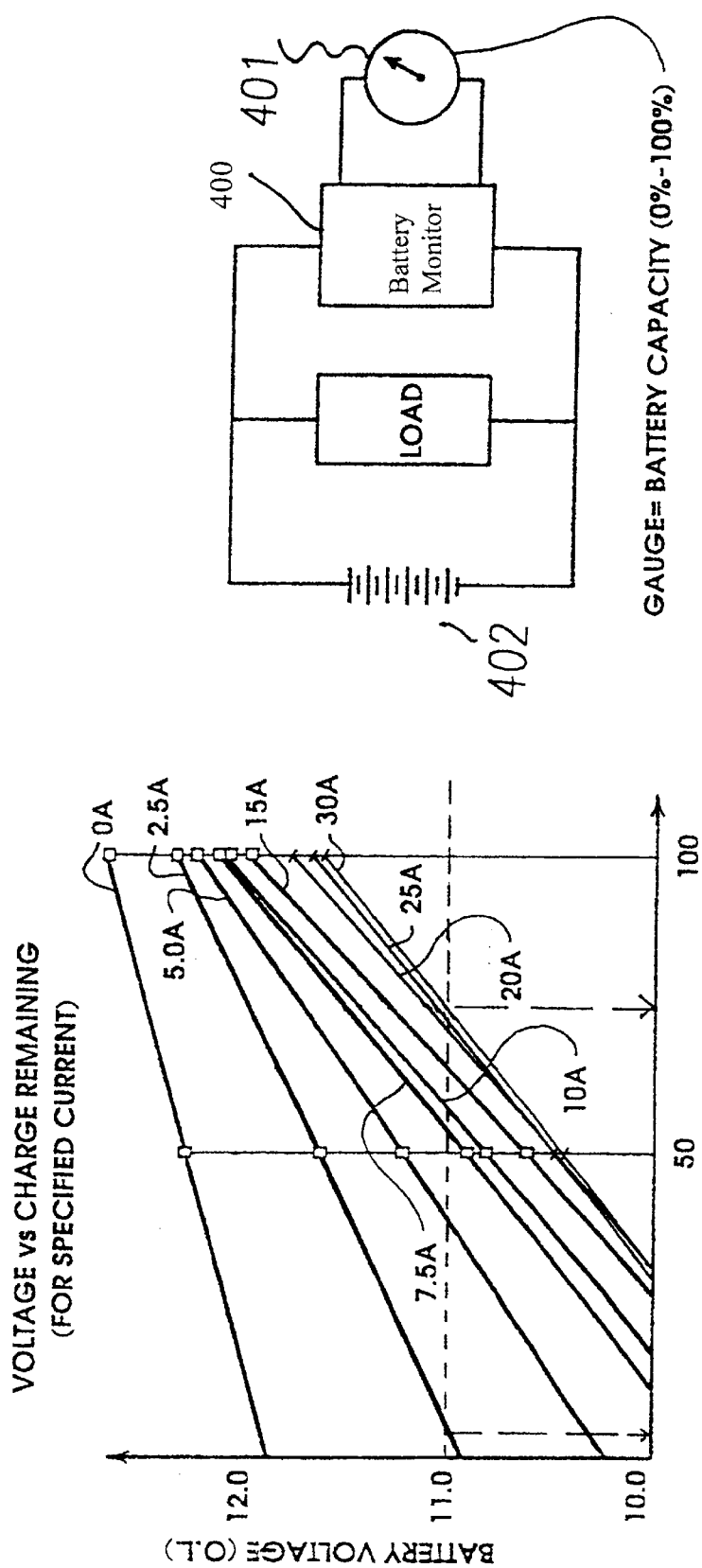
FIG. 3A is a graph of battery voltage versus % Charge Remaining for a lead-acid battery.
FIG. 4 is a block diagram of the battery monitor in use, with an optional battery capacity gauge connected to the battery monitor.

Refer to FIG. 3A. The majority of prior-art battery charge conservers sense a voltage only as an indication of charge. Suppose 11.0 V was used as the criterion (for a 12 V battery) then according to this graph, a battery delivering 2.5 A at the time would be isolated for conservation when practically empty, while a battery delivering 30 A at the time of measurement would be isolated for conservation at about 75% fully charged. In FIG. 3B—a different set of measurements—if 12.0 V was used as the criterion then according to this graph, a battery delivering zero amperes at the time of measurement would be isolated for conservation when 20 Ah has been used (any anything from 0 to 20 Ah is left, depending on the age of the battery), while a battery delivering 17 A at the time of measurement would be isolated for conservation immediately—at its fully charged state.

The preferred forms of the invention take into account both voltage and current and thereby allow much more precise determination of the point at which to isolate the battery. (The preferred resolution is to the nearest 0.1 V and the nearest 0.1 A. The box labelled 301 in FIG. 3B is greater than the resolution inherent in the preferred embodiment of this invention).

I have added ambient temperature measurement as a preferred option—so that the difficulty of engine starting as in cold weather can be taken into account in the evaluation.

I have found that the apparent internal resistance of a lead-acid battery is non-linear; it is not a simple ohmic resistance. It is reduced as the current drawn goes up; so that for a typical car battery it is about half the minimal value when about 15 A load is applied. FIG. 3C depicts this effect; showing apparent internal resistance in relation to charge used and battery age. Ohms are shown on the vertical axis, and charge used is along the horizontal axis. For the new battery, about 20 Ah remains at the end of the trial but an uncertain smaller amount remains for the old battery (otherwise in good condition). Points were calculated as usual, using the voltage difference between no load and a set load, divided by current.

In order to derive the data, a 45 Ah battery was fully charged, then discharged at 4 A; while at constant intervals measurements were taken at a range of currents. It appears that in this case at least the internal resistance itself does not offer a particularly useful indicator of the remaining charge, because the internal resistance is not greatly affected by the state of charge within the middle of the range. In the fully charged state at the left side, surface effects predominate.

The nonlinearity of internal resistance results in the family of "curves" or voltage v charge plots shown in FIG. 3a or in FIG. 3b tending to lie closer together at higher current drains.

While it is possible to read an ordinary ammeter and then a voltmeter and then refer to a book of tabulated numbers, I prefer to provide an electronic instrument that provides an indication of an actual charge, and/or automatically carries out certain actions if a charge is less than a predetermined amount. The preferred invention is compatible with vehicle operation; drivers cannot refer to books while driving. It is also compatible with unattended monitoring.

Although there is a relatively complex basis for the internal resistance, I have derived an algorithm that provides the amount of charge remaining given a voltage measurement and a simultaneous load measurement. Given the good addressing capability but limited processing capability of present-day 8-bit microprocessors I prefer to simply store a table of remaining charge by constructing a reference table or look-up table which is based on actual measurements.

The look-up table comprises (in principle) a n-dimensional addressable matrix of numbers. In fact it can be a linear memory array addressed through a serial interface. Typically each number is an 8-bit value. For example, one row of the matrix may hold a series of values; each row corresponding to a 0.1 V increment above a lower level of say 11.3 V, giving rows "named" 11.3, 11.4, 11.5, 11.6, . . . . Each column corresponds to a certain measured current, generally in 0.1 A steps in the range of from 0 to 25 A. The value placed in each cell represents the state of charge; a figure proportional to the Ampere-hours remaining in the battery. The evaluation device uses that data as a basis for action. Temperature (that is, ambient temperature not battery temperature) can be incorporated as another parameter and it is generally convenient to adjust either the voltage or the current reading with a view to increasing the conserved charge in colder weather. Extrapolation for in-between readings is generally done by truncating measurements at the input stage.

The microprocessor compares the value from the selected cell in the matrix with a stored constant, and takes action if the battery is recognised as being insufficiently charged. Typically the action is appropriate steps for disconnection.

The following circuits illustrate present embodiments of the invention. It should be realised that in a fast-developing field such as electronics, there are many alternative ways to accomplish a desired result and in particular advances in integrated circuit manufacture already permit the multiplexer, the A-D converter, the memory and the microprocessor to be fabricated on a single chip.

Note that in any of the following circuits it may be necessary to provide further protection to the components from known automotive supply voltage fluctuations (often described as extreme) and even transient supply reversals. One can even get current flow from a free-wheeling fan motor.

First Embodiment "Analog computer" approach.

Figure 1:
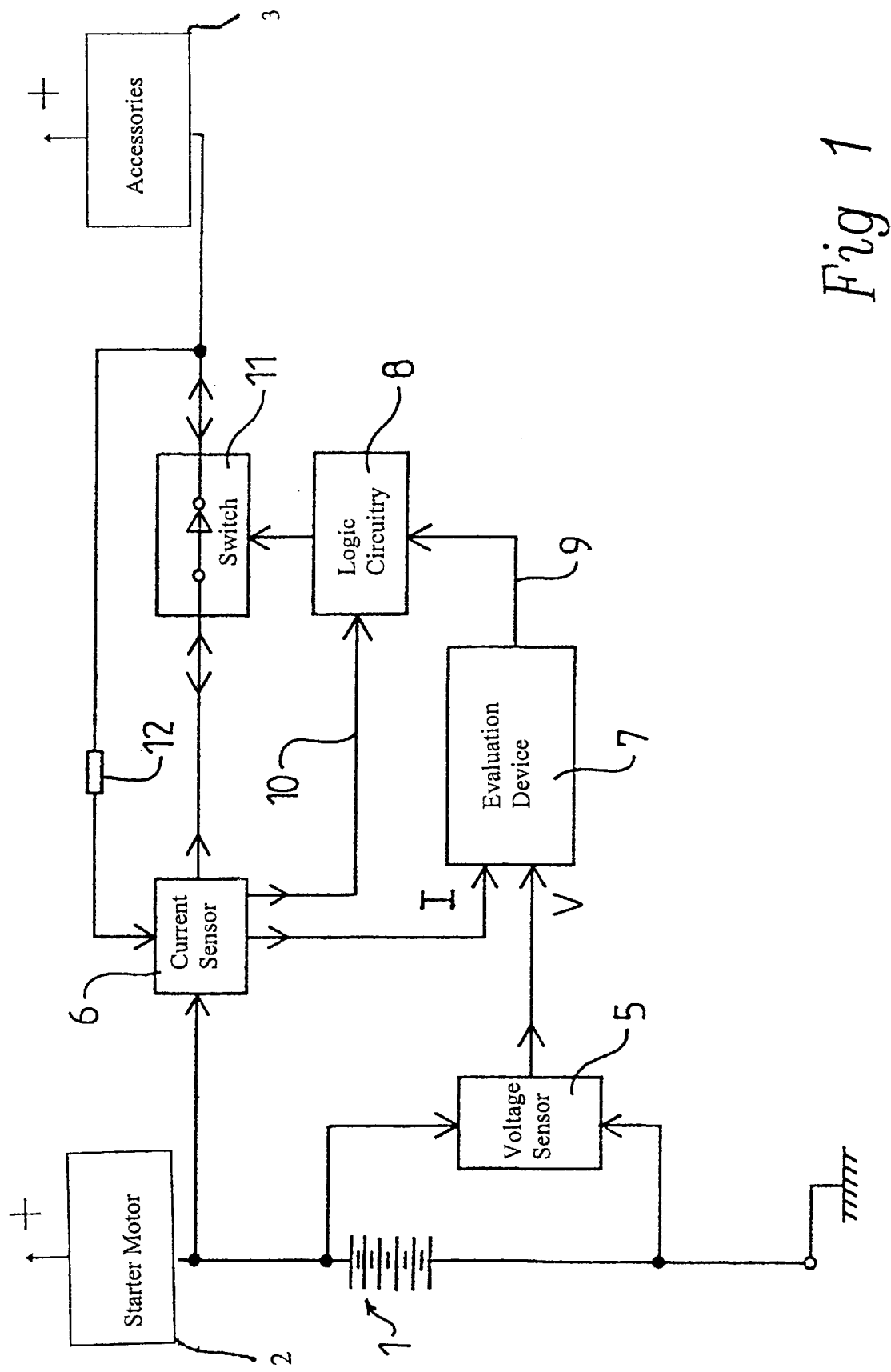
FIG. 1 is an illustration of the battery monitor connected to an automotive battery and an isolating switch.

FIG. 1 illustrates the general configuration of one early embodiment. The storage battery I has connected to it a starter motor at 2, and accessories such as lights and radios are connected at 3. A voltage sensor 5, and a current sensor 6 transduce the battery output and provide inputs to an evaluation device 7, which is connected to logic circuitry 8 that controls a switch or relay 11. Input 10 to logic circuitry 11 carries "re-start" signals so that the system can automatically reawaken if it has switched off the battery in the event of over-consumption, so that the vehicle can be used again without taking specific steps to return the circuit to normal. Bleed resistor 12 provides power that enables sensing of a change in demand.

This embodiment of the device is capable of disconnecting a partially discharged battery and reconnecting it when an "ignition switch" like load is connected. Both voltage and current information are scaled and fed to a comparator. (This circuit has no look-up tables; it assesses whether or not a single condition as defined by scaling constants has been met. These constants are embodied in operational amplifier gains and can be set as is well known in the art by adjusting variable resistances. I have found this circuit inferior in versatility to a digital version, hence the digital computer circuit of the third embodiment is generally preferred). This first embodiment of a battery monitor is illustrated in FIG. 1 and particularly FIG. 2 which show a prototype of the invention.

Figure 2A:
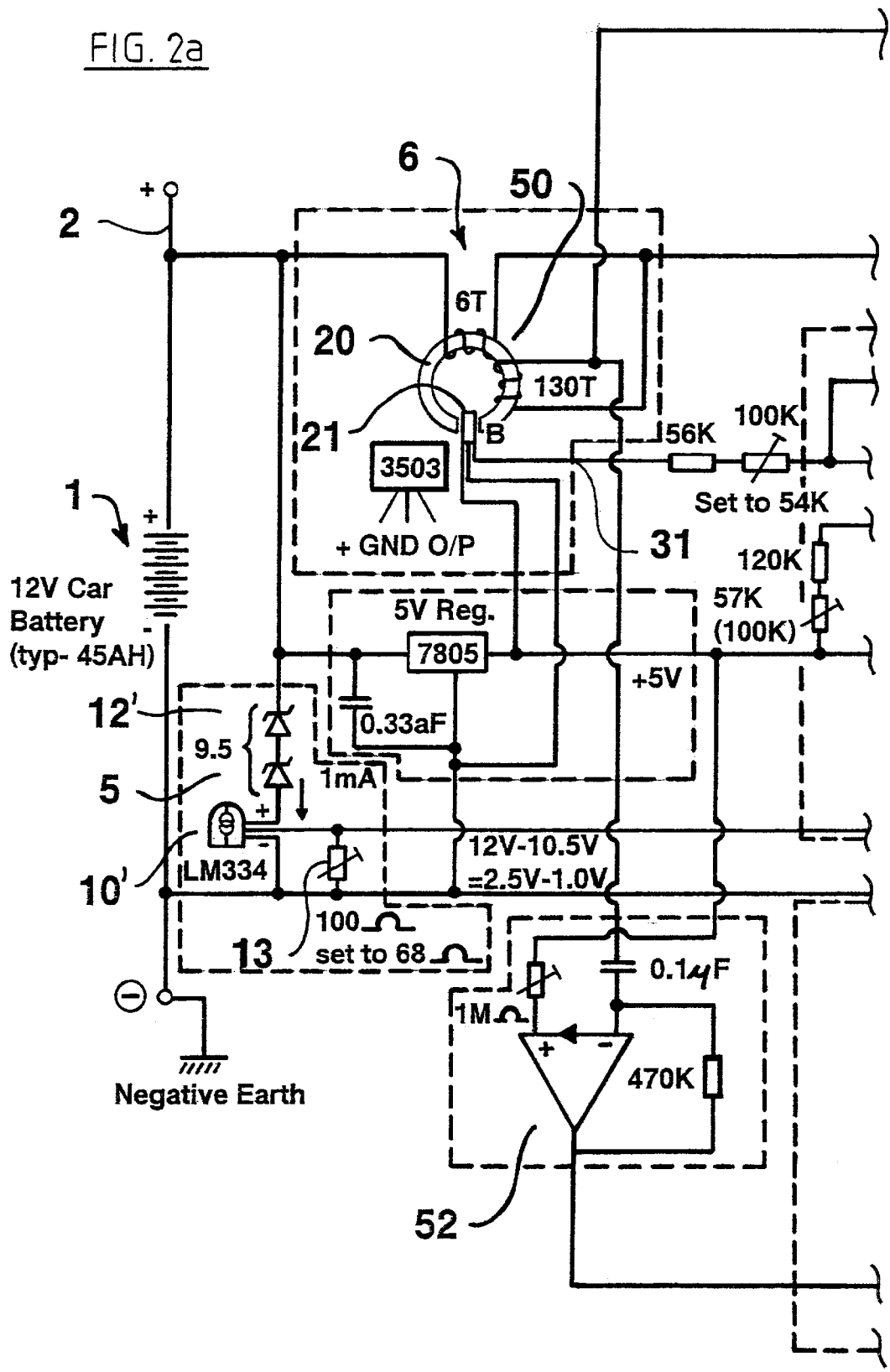
FIG. 2 is a circuit diagram of a first form of the battery monitor for use with an isolating switch.
Figure 2B:
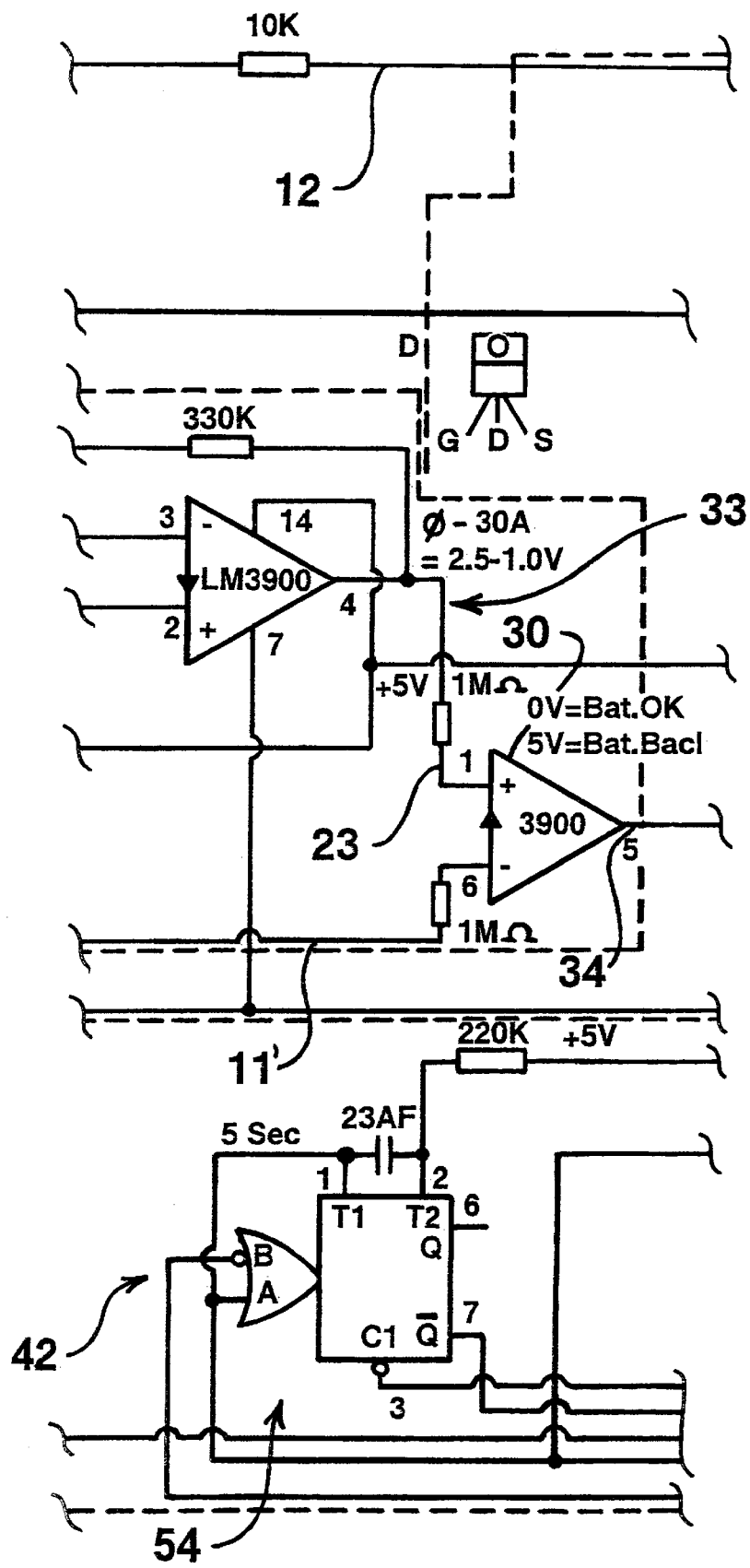
Figure 2C:
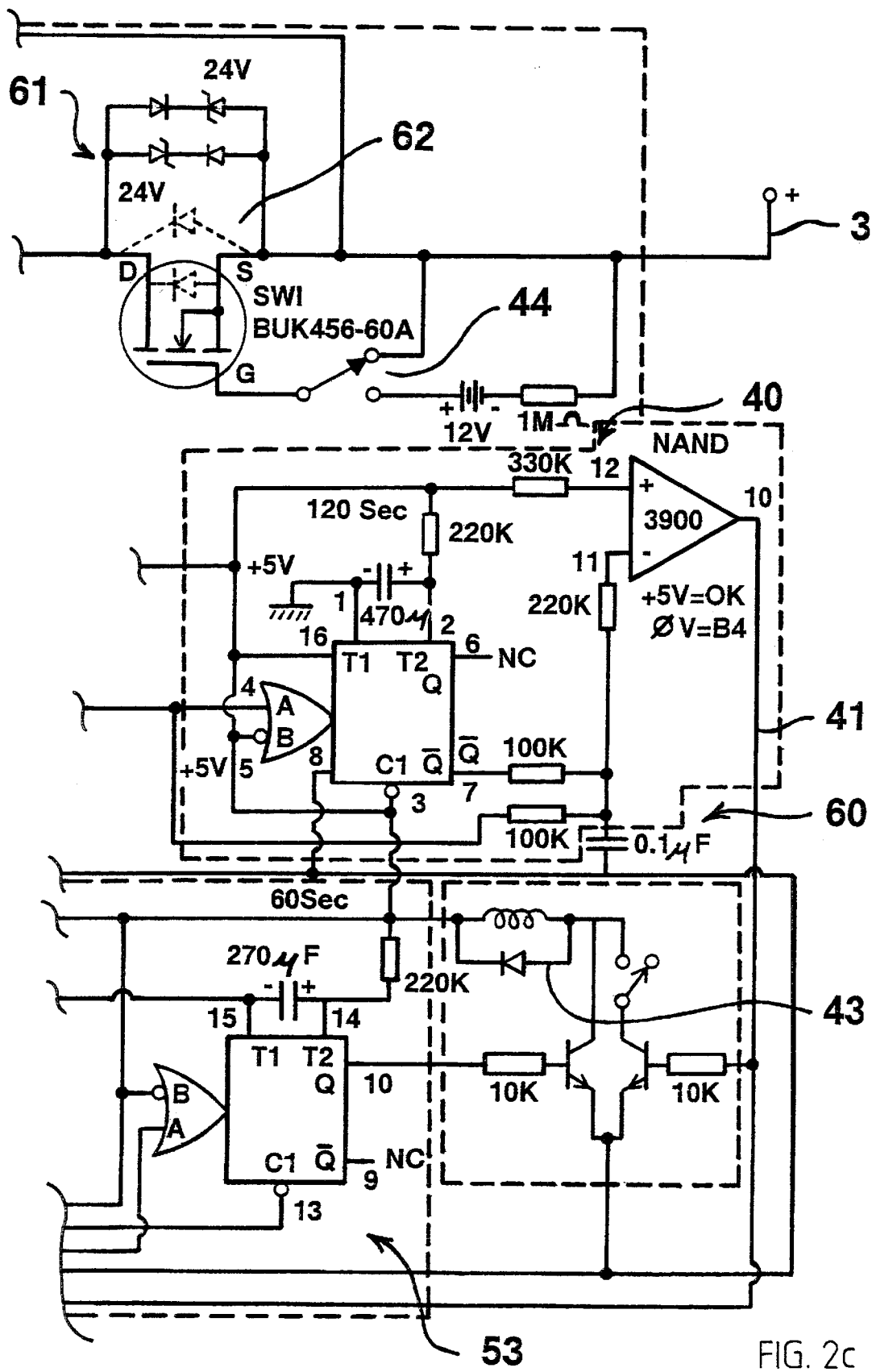

I shall describe the circuit with reference to FIG. 2. The battery to be monitored is shown at 1. The battery voltage sensor, in the dashed box 5, includes a constant current device LM334, reference 10', from which a voltage value proportional to the voltage in the battery 1 is obtained in lead 11'. Zener diodes 12' and variable resistor 13 provide a voltage divider so as to obtain a voltage in the lead 11' which is over a satisfactory range.

The current sensor circuitry 6 may be provided in the following manner. A toroid such as a dust iron toroid 20 may be provided and around the toroid a small number of turns, such as six turns of the lead 3 carrying battery power to a consumer are wound. A Hall effect device 21 is provided or positioned in a slot cut into the toroid and an output is taken at 31, and amplified or otherwise shaped as required in conditioning circuitry 33, then fed along lead 23 to a comparator. The construction described gives a substantially linear voltage according to the magnitude of the field intensity as sensed by the Hall sensor, which is variable according to the current.

In the embodiment described, suppose that the voltage sensor senses a drop in battery voltage from say 12V to 10V, corresponding to a change in drawn current from substantially 0 amps to 30 amps. The effect of the LM334 is to reduce the voltage in 11' to a range of perhaps from 2.5V to 10V. It narrows the effective range of the voltmeter.

Comparator 30 compares scaled versions of the current and the voltage. One could say that it employs a version of the current to establish a reference point against which to compare the voltage. Comparator 30 is a kind of analog computer arranged so that, for example, if the "battery voltage" value exceeds the "current voltage" value then the battery is taken as acceptable and a voltage output on line 34 of, for example, 0 volts is provided as the result of a comparison, but if the "current voltage" value exceeds the "battery voltage" value then further battery depletion is considered as unacceptable and in that case the other possibility, a 5V output on line 34 is created. Circuitry 40 to process the comparator output is provided, offering in particular anti-spike circuitry which introduces a delay for a selected period of time such as 120 seconds before any action is taken by the circuitry. Thus a transient spike from the comparator will cause no effect. If however the signal from the comparator 30 continues for greater than the predetermined time the processed output appears on line 41 and is transmitted to circuitry 42, which operates a relay 43 will cause the relay contacts 44 to open. This cuts the circuit to accessories 3.

In order to restore function at the time of (for example) starting the engine, assuming that the circuit has operated to disconnect a too-demanding load, means is provided to sense a change in battery load. For example a car owner operates a central unlocking mechanism or the central; courtesy light is turned on, whereupon the circuit enables starting for 2 minutes (arbitrarily). The transducer is the 130 turn winding 50 on the current-sensing toroid. Pulses made by module 52 in response to field fluctuations have the effect of turning off current in the relay 43, hence changing contacts 44 from the upper contact (gate at source potential; no current flow) to the lower contact (gate at +12V, current flow occurs through turned-on FET).

Through line 7' (FIG. 2) a small current of about one milliamp may flow through the 10K resistor when the switch is "off" and this will enable a change in load condition, caused for example by switching on the ignition to be sensed in winding 50 which will cause the sensing circuit 52 to operate and supply a signal to the circuitry at 53 which will cause the relay to again operate to close the isolating switch SW1 through contacts 44. Block circuitry 54 is provided which introduces a delay of, for example, 5 seconds or so to stop retriggering caused by the windings 50 sensing a legitimate switch off. Capacitor 60 is a slow down capacitor. The diodes 61 provides anti back EMF protection. Diodes 62 (shown pecked) may be required to prevent switch off during normal engine operation.

In use, when the engine is switched off, if there is any drain on the battery and the capacity of the battery drops the voltage will also tend to drop. When the relative voltage and current as sensed as and above described reaches the predetermined position then the comparator will cause a signal to be given which will have the effect of operating the relay and switching the isolating switch off. With a change in load, for example, such as switching the ignition the circuit will be switched back on as above described. Thus it can be seen that at least in the preferred form of the invention a switch is provided which has the advantage that nonessential services can be switched off if the battery begins to fail. This provides a desirable battery save circuit which will allow a substantial number of crankings to be achieved even if, for example, the lights of the vehicle have been left on when the driver exits the vehicle.

I have found the use of a multi-turn toroid to be a complex way to accomplish load sensing and prefer to use amplification of electronic impulses instead, as in Embodiment 3.
Second Embodiment Battery charge gauge with analog indicator.

In some cases the battery monitor 400 may be connected between a battery 402 and a gauge 401 (as shown in FIG. 4) rather than an isolating switch (as in FIG. 1). The gauge can provide a useful display of the percentage charge remaining in the battery (in the manner of a "fuel gauge" in a vehicle). This is particularly advantageous in the case of cell phone batteries or batteries for emergency equipment, or computers, or for the batteries used in electric vehicles. (This list is exemplary only as it will be appreciated that a battery monitor of this type will be useful in many applications).
Third Embodiment Microprocessor used as a battery charge estimator, with switching and optional gauge outputs.

I provide means to quantify the voltage across the battery terminals and also means to quantify the current flowing into or out of the battery. Optionally I also measure the environmental temperature. These inputs, preferably adapted by means of analogue-to-digital conversion into a format compatible with microprocessors, can be led to a microprocessor equipped with a suitable program and also equipped with a knowledge base by means of which it can evaluate the state of charge of the battery and take the appropriate actions. Actions may be switching off a non-critical load, re-connecting the system when a critical requirement is to be met, and displaying the state of charge on a visual instrument of some type. Of course it is also possible, with modifications, to have this device also control charging of the battery.

The "knowledge base" referred to above may be provided in the form of parameters suitable for use in a mathematical equation, but given the relative degree of difficulty in implementing a mathematical procedure in a microprocessor having limited capacity for processing floating-point numbers, it is preferable to provide the knowledge base as a n-dimensional addressable matrix of numbers, known as a look-up table. Typically each number is an 8-bit value. For example, one row of the matrix may hold a series of values; each value representing the voltage to be expected of a sufficiently charged battery at any current drain over a range but at a particular temperature. The next row may be the row used at a different temperature. If the microprocessor finds that the voltage held within the table is greater than the voltage measured, it defines the battery as being insufficiently charged and takes the appropriate steps for disconnection.

In order to provide an analog value, the lookup table might be arranged so that each row (the row having been selected by the measured current) holds a series of voltage readings each corresponding to a particular state of charge. The row is examined and an output is activated according to the position of the first entry that is greater than the actual, measured voltage.

One possible output device for displaying the state of charge is a pulse-width modulated output connected to a moving-coil meter. Another is a series of light-emitting diodes in a row. A further output is a numerical seven-segment display.

Figure 5A:
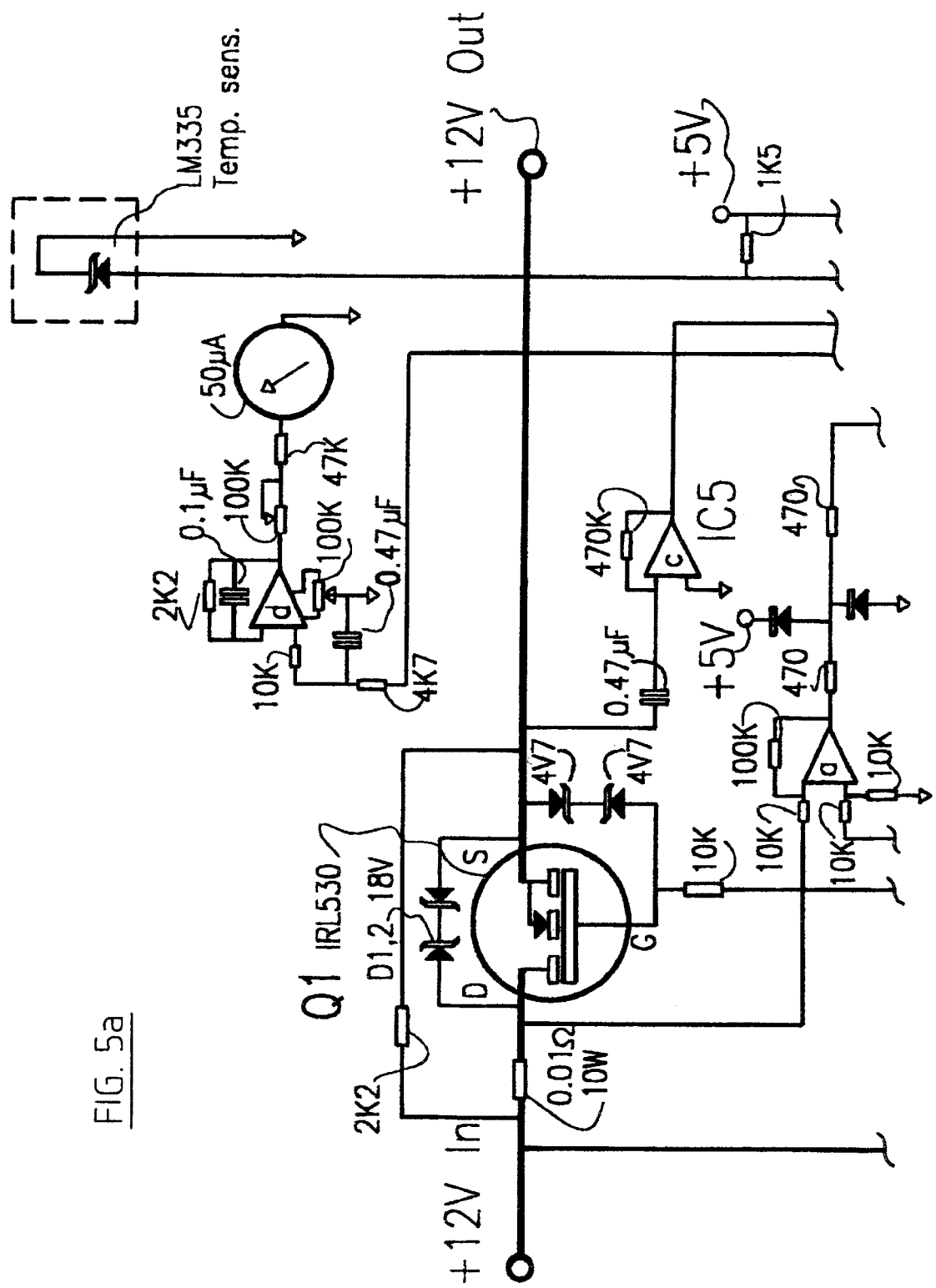
FIG. 5 is a circuit diagram of a microprocessor-based battery monitor.
Figure 5B:
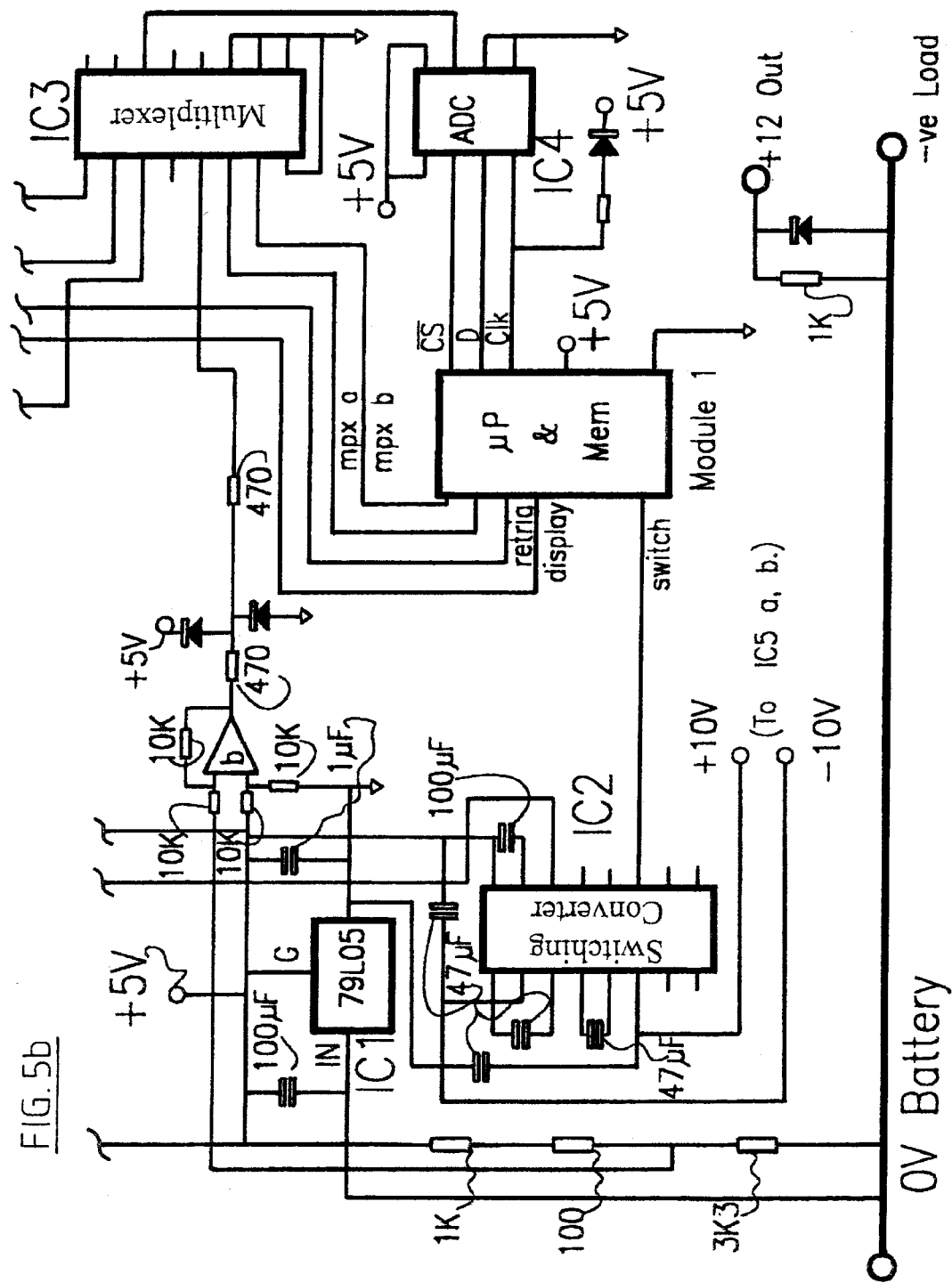

The display can be used as a "fuel gauge" as for an electric car, an "ampere-hours supplied" readout for an electric fuelling station, or a battery state-of-charge reading for automotive electricians or for marine use, for rechargeable electric flash units, transceivers, etc.
Details of the circuit of FIG. 5.

Sense resistor 0.01 ohms 10 W acts as a current-to-voltage transducer. (This resistor comprises six 1 cm lengths in parallel of 6 ohm per meter resistance wire, soldered onto the circuit board). The voltage across this is amplified ten times by difference amplifier IC5a (here identified as a triangle with the letter 'a') and passed to one input of the multiplexer IC3, a CD4051 CMOS Switch. When so switched, the current signal (where 1V=10 A) is passed to the analogue-to-digital converter IC4 and then as a serial digital signal to the microprocessor.

Alternatively current measurement can be implemented with a current-sensing HEXFET. If it is switched ON, a fraction of the current flowing through its drain-source line appears as a voltage between terminals 2 and 4. An operational amplifier configured for a suitable gain gives a 0–5 V range for 0–25 A current.

Voltage measurement:

Device IC5b (identified as the triangle bearing a 'b') amplifies the difference between the +12V supply and a potential from along a voltage divider input by −1. The output is fed to the multiplexer IC3. Devices IC5a and IC5b are a dual operational amplifier LM358 or equivalent, and are powered by +10 V and −10 V lines from the charge pump device, IC2.

Activity sensing:

IC5c inverts and differentiates (at high gain) the output line voltage—the vehicle buss (see FIG. 7—703) and passes its output to a retrigger input of the microcontroller module. When the battery is isolated, a bleed resistor bypassing the switch provides a small current to create a voltage on the bus. A 1K resistor to ground is useful in those vehicles that have no constant loads such as a clock. The changes are caused by a driver operating a courtesy light on opening a car door, or turning on the ignition, or some similar action. Then, any change in load on the isolated bus will cause a change in the voltage that can be detected by IC5c. The small voltage spike or transient that comprises a signal to re-enable the battery supply when the driver returns to the vehicle is converted from a small DC step drop into a pulse large enough to appear as a 0–1 transition to the data input line D1 of the digital circuit of FIG. 5. Note that IC5a is powered from +5V and ground rails so that its output remains acceptable to the microprocessor. Other electrical activity sensing means may be used, such as that of FIG. 2.

Internal Reference Ground and Internal Power Supply:

The ground in this circuit board is held by the 79L05 three-terminal regulator device at five volts less positive than the input battery line; that is, at about 7V. This gives internal components latitude for operation within specified voltage ranges. For example, the current sensing resistor appears to be at +5V to the difference amplifier, which, being fed with + and −10V, is easily able to operate.

In our preferred version I use a MAX232 switching converter to generate bipolar voltages from a five volt input. This device is shown as IC2. A line conventionally used for a RS232 drive with such chips is here used to drive the base of the FET switch with a suitably high voltage, under microprocessor control by output D2.

The FET shown here is an International Rectifiers type IRD 530; $I_d$max=15 A, $R_{ds}$=0.16 ohms at 9 A, $V_{GS}$=5 V. It is possible to use several in parallel, or a larger-capacity HEXFET. If a MOSFET is used such as a Philips BUK45-200A, it should have a diode connected across it in reverse to simulate the ghost diode of a HEXFET. This allows reverse current to flow, as during charging, because the circuit is otherwise capable of measuring inwards as well as outwards currents.

The circuit using IC5d for indicating the state of charge is optional; it drives a moving-coil meter from a pulse-width-modulated output from the microprocessor. The circuit is a leaky integrator and averages the pulsed input. Actual parts values depend on the kind of meter used; these are for a 50 microampere meter. Of course many other types of display could be used; lamp-based displays, voice synthesisers, and the like.

Figure 6:
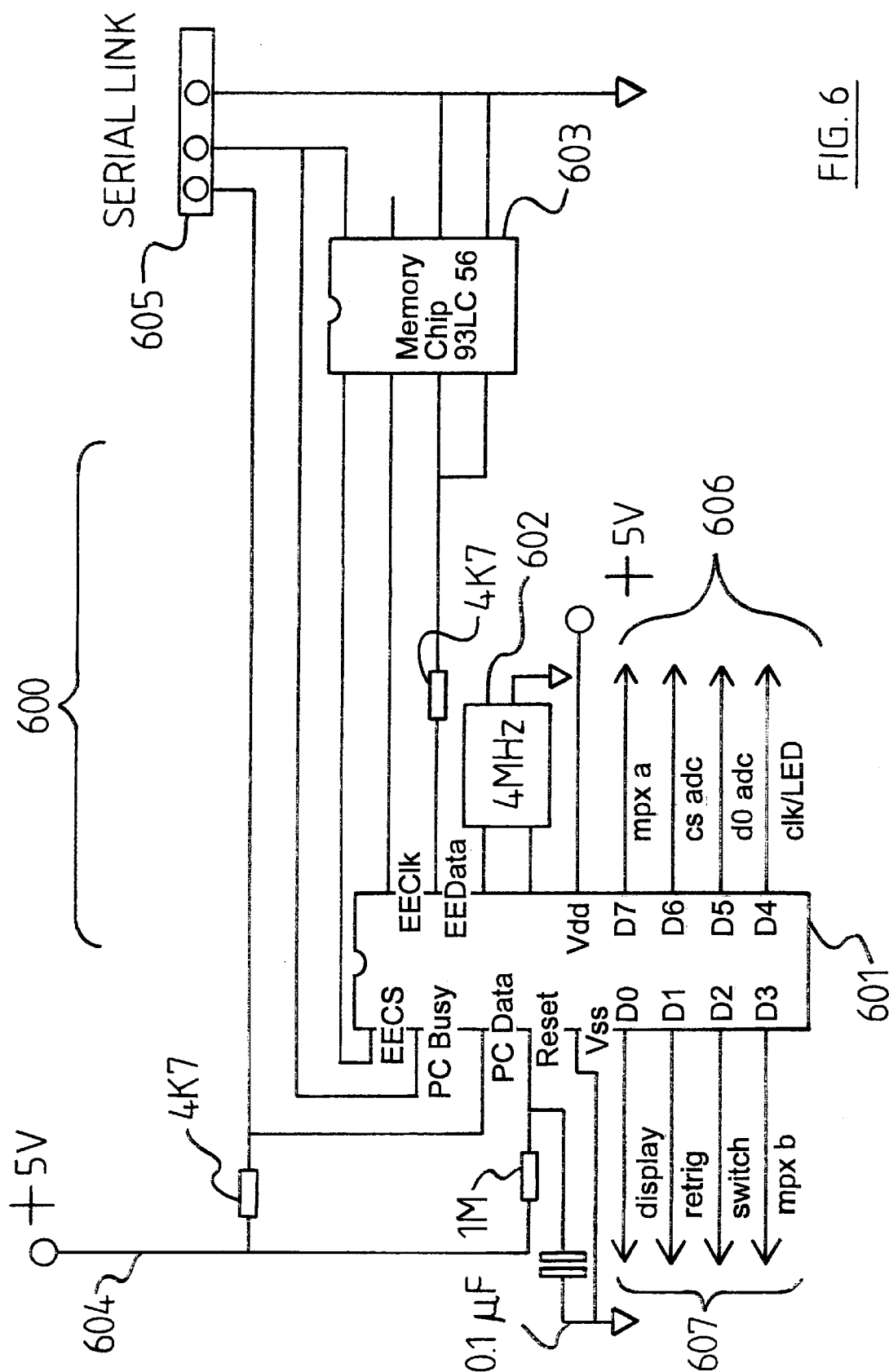
FIG. 6 is a block diagram for the microprocessor itself.

FIG. 6, a block diagram for the microprocessor itself, shows an arrangement 600 for using a PIC16C56 minimal microprocessor, 601 in conjunction with a serial memory chip 603. The eight data lines of this microprocessor are used for specific purposes such as for interfacing with the A-D converter (606) or for accepting retriggering signals or for sending out switch control signals or the like (607). The block 602 is a 4 MHz resonator. There are of course many available options for use here, such as the 80C552 (Philips/Signetics) which includes multiplexing, memory. and A-D functions on the one chip, optimised for automotive applications.

FIG. 7 is an overall block diagram of a system 700 suitable (for example) for an internal-combustion engine car, an electric car, or an alternative power system. Here, 702 represents a storage battery and 701 is the device of the invention. 706 is a motor such as a starter motor (though it could be a traction motor) and 705 is a charging dynamo (or the like) connected to a vehicle buss 703, as are various accessories such as the example headlights 709. All devices including the starter motor are in this example capable of being switched off by the switch 716, after current and voltage sensing means 710 have sent signals to an evaluator 711. The bleed resistor 713 and the sensing amplifier 712 serve to re-energise the device if the vehicle buss, when disconnected from the battery, experiences a change in load. 704 represents an optional display of the state of battery charge.

In the case of an electrically powered vehicle, 705 is probably an external source of charging power, 706 is an example traction motor, and 709 shows example loads such as headlights. In the case of an alternative power system, 705 remains a generator, 706 can be any example motor, such as that of a refrigerator, and 709 are example loads such as lighting in a house. In an alternative power system the batter monitoring means may also provide an output to enable a charging device whenever the battery reaches a predetermined state of depletion, so that the battery cycle depth is controlled and wear and tear on the generating means and depletion of the source (such as if it is hydro-electric) is minimised.

It will be appreciated that the block 710 could be placed within the battery housing, or adjacent to the battery, or anywhere else in the vehicle (subject mainly to heavy current-carrying cable runs). The block 710 may be made impervious to corrosive electrolytes for use close to or within a battery.

Software

I have not provided a full software listing because the software involved does not incorporate any unusual features not immediately apparent to a skilled technician. Yet the software does generally incorporate many features required by the hardware configuration used; thus in the PIC16C56 selected, considerations include only 35 instructions and a small code space. The following pseudocode (together with a suitably loaded look-up table or LUT as per FIG. 3B) embodies the principles of the evaluation decision.

```
power-on reset and initialisation
LOOP:
    get voltage value
    get current value
    get temperature value and compensate voltage (or
        current) value
    compute LUT address and go to LUT
    get VALUE from LUT
    if VALUE less than constant MINCHARGE,
        set COUNT=1
        Call TLOOP
    endif
end of loop
TLOOP:
    Flash the status LED count times.
    Wait one second
    get voltage value
    get current value
``` get temperature value and compensate voltage (or current) value compute LUT address and address LUT get VALUE from LUT If VALUE is more than the constant MINCHARGE, exit TLOOP increment COUNT if COUNT more than 10, switch off the switch (Q1 of FIG. 5).

end of loop.

Return

Here, the variable VALUE was one of many numbers stored in the memory comprising the look-up table, and addressed by using a measured voltage value and a measured current value, perhaps with temperature (or the like) adjustments. The constant MINCHARGE represents the minimum charge to be reserved within the battery for critical applications.

Thus the switch-off procedure involves a ten-second (or so) period of re-testing the battery voltage and current before action is taken. This duration should avoid most inadvertent switching off. The flashing lamp may, if the driver can see the lamp, warn him of imminent trouble for the battery monitor is mainly intended for use when the vehicle is unattended.

Using a Formula rather than a Lookup Table.

I have implemented this approach using integer maths and 16-bit words. Consider the curves of FIG. 3b. They are close to straight lines, and hence each can be represented by the formula $$P = m.v + C \qquad (1)$$

where

P=percentage change m=slope, v=measured battery voltage

C=intercept on horizontal axis.

m and C both vary according to the load currents. Empirical formulae have been derived relating m and C to the load current for a typical lead-acid battery. Assuming that we range P from 0 to 100 (in order to avoid decimals), then $$m = 39 + 29800/(I_L + 7)^3 \qquad (2)$$

$$C = -353 - 392300/(I_L + 7)^3 \qquad (3)$$

$I_L$=load current in deci-amperes.

Or, we can remove the negative signs from the formula for C (see (4) and use (1)

$$C = 353 + 392300/(I_L + 7)^3 \qquad (4)$$

and output the value of P to a meter or other display device, and/or cause the HEXFET switch to open if the battery charge is less than a certain level (such as 50%). Our algorithm has been written to conserve a 50% charge, while the look-up table approach (below) has been written to conserve about 20 Ah.

The microprocessor can preferably detect unusual conditions such as a "surface charge" that appears on a lead-acid battery with no applied load.

Nevertheless I find that a lookup table stored in a read-only memory is a highly convenient way to store the battery discharge characteristics. Given a 256-bit resolution A-D conversion, one could use voltage as the low byte address and current as the high byte address of a large storage device (say a 65536 byte store) and load a figure proportional to remaining charge in each cell so addressed. This represents unnecessarily high resolution, so the permissible range of addressing may be reduced accordingly to a lower resolution such as 64 increments in each direction for a 4K store. Intermediate measurements may either be truncated/rounded, or extrapolated to lie on an existing line on which there could be as few as 4 or 8. At the present time, 1024 byte serially addressable memories offer an adequate storage medium for a lookup table.

When in use, the microprocessor determines from the incoming measurements which cell to address, and reads back a value which is proportional to the charge remaining, as previously determined by trials. The returned value may be scaled from 0 to 255 (8 bit byte) or some bits may be reserved for other purposes, such as being set for a switch-off function or left clear otherwise.

The battery monitor of this invention is preferably calibrated for a particular type of battery so that its "turn-off" curve is calibrated in a similar fashion to that shown in FIG. 3A. This is a graph of battery voltage against "percentage charge remaining in the battery" for different currents.

It will be observed that the turn-off curve descends from left to right and curves markedly under itself (ie departing from an approximate straight line) as the current increases from 5 to 30 Amperes (for a 12 volt automotive lead-acid nominal 40 Amp-hour storage battery). This turn-off curve illustrates the usefulness of current measurement as well, for if voltage alone was used for assessment of charge, the switch-off point could be quite variable in terms of remaining charge.

This graph can be used to construct a look-up table for a microprocessor controlled battery monitor and used to provide the output for a battery gauge (calibrated in percentage charge from 0–100% charge) and/or to provide the predetermined switching point for an isolating switch. With reference to FIG. 3B and FIG. 3C it should be noted that the battery tested was a standard New Zealand automotive 12 volt lead acid battery of 40 amp/hour capacity. The graphs shown in FIG. 3A, B, or C will vary somewhat for different types of batteries, for example nickel-cadmium batteries, or metal hydride batteries, or other formulations of lead acid batteries. Lead acid batteries are formulated for different climates, duty cycle, or different temperatures.

The method for evaluating a new type of battery for this invention generally comprises the steps of fully charging the battery, measuring the terminal voltage at a range of currents, depleting the charge in the battery through a series of steps towards a state of being fully discharged, and recording the terminal voltage at each of the range of currents at each step. Then the temperature dependence of the voltage is preferably determined. The measurements, perhaps scaled so as to better match the 256 values of an 8-bit storage cell, characterise that type of battery. They are loaded into an addressable permanent memory means such as a flash memory chip, where they comprise a look-up table.

The method for determining the cutoff point for switching off non-critical loads usually involves determining the number of ampere-hours required for successfully starting a petrol or diesel engine under worst-case conditions. It is useful to take the ambient temperature into account when determining this and the microprocessor device is capable for example of ensuring that the battery stores more charge if the ambient temperature is low. Alternatively one can simply decide to retain half a full charge for critical, starting-up purposes.

Building the circuit into a battery

It is possible to build this circuit into a lead-acid storage battery and as a result guarantee the "intelligent" battery for a longer lifetime than was formerly possible, largely because of protection against deep discharge. The battery is a single, conventional battery and may be provided with the usual two (positive and negative) terminal posts. Optionally a third outlet for a charge gauge can be provided, and optionally a third active terminal post can be provided for switched accessories while the second active terminal post is reserved for the starter motor. A circuit like this could record the battery's life history in a memory such as an EEProm or flash memory.

Modern "HEXFET" solid-state switches that are capable of controlling currents of the order of 500 A are now reasonably cheap. Thus this circuit is capable of being placed in series with the starter motor as well as the other electrical circuitry of a car, as shown in FIG. 7. This has the advantage that a single unit, the battery, now contains its own charge conservation means and avoids the two-battery solution offered in some prior art. The electronics can be protected against corrosion by electrolytes using potting agents and the like.

Building the circuit into a car—or into an electric car

It may be convenient to include at least the method and algorithms of this invention in a more comprehensive vehicle management computer, rather than to use a stand-alone device. Such a computer may include engine management or, if an electric car is used, it may include means to control the motion of the vehicle. In the case of an electric car, maintaining a reserve of charge despite inadvertent current drain is equally as desirable as is retaining means for starting an internal combustion engine.

Failed Alternator scenario

The following algorithm for detecting a failure of charging has been implemented. Note that charging current can flow backwards through the preferred HEXFET solid-state switch without impediment, through its "shadow diode" and note that the preferred embodiment of the invention is capable of measuring current in either direction. The algorithm comprises the steps of determining that the engine of the vehicle is running, possibly by looking for signals representing spark generation or the like, or using separate inputs, but recognises that no significant charging current is detected.

Most drivers, upon finding that their alternator is not charging the battery would prefer that they get as much driving range from the vehicle as possible, (in order to reach a workshop and get the vehicle serviced) so if the algorithm determines that the charging means is inoperative (perhaps through a broken fan belt) but the car is running the invention will attempt to retain a much lower charge than usual, or perhaps almost none at all, by not disconnecting the accessory circuit from the battery. (This is a special case, contrary to the usual aims of the preferred embodiment, and is dependent on human customs or preferences).

Old Battery scenario

The following algorithm for detecting an old battery has been implemented. Refer to FIG. 3C for an illustration of data that includes an old battery. The dashed curves, taken from an old battery, show a trend for the internal resistance to rise more quickly when the charge has been depleted. Given that observation, a microprocessor can hold, in a long-term variable, a factor representing the internal resistance determined at (a) a high current (say 17 A) and at a relatively depleted state, whenever the processor considers that these conditions have been met. This variable can then cause the selection of (for example) a second look-up table adapted to reflect the capability of an old battery, or this variable can impose a bias on the voltage or the current reading so that a different part of the original look-up table is used. Thus a decision to disconnect a drain on the battery is taken earlier if the battery appears to be an old one. Thus there is a greater chance of retaining a reasonable charge.

Low Electrolyte and other battery faults scenario

Battery faults almost without exception will result in either a lower no-load voltage, or a much lower voltage under load, or both. Hence our means for detecting and allowing for an old battery (see above) will also apply to most other battery faults. Usefully, an indicator lamp or some such device can be brought to the control panel of the vehicle to alert the driver of a battery in poor condition. This lamp would be energised or not depending on the value of the long-term stored variable.

Variations

The above examples have been developed with a 12 V lead-acid storage battery in a vehicle (such as a car, plane, or boat) as the most likely application.

The method has yet to be evaluated with other existing and to-be-developed types of battery, such as nickel-cadmium batteries, metal hydride batteries, or other formulations of lead acid batteries. Metal hydride batteries have no memory problem unlike nickel-cadmium batteries and for example are used in cell phones. Most types of battery exhibit (as well as changes in output voltage) changes in effective internal resistance during discharge, like those of lead-acid batteries, although the magnitude and direction of changes may be a function of the types of battery, There are many applications using where an indication of remaining battery life is useful even if battery replacement is required to replenish them. A cell phone gauge (e.g. calibrated in "talk time") will be very useful. There is a need for a "fuel gauge" for almost every rechargeable battery application, especially in emergency equipment such as medical life-support equipment or telephone exchanges.

The circuit may be designed with identified gain-adjusting components (such as those around the measuring points) so that it can be adapted for batteries having other numbers of cells and hence different voltage or current ranges with minimal redesign. If the device is to be used on batteries having less than about 6 volts output when low, it may be useful to raise this voltage to 7 or 8 volts for the circuit's own power supply, because presently available devices generally prefer a 5 V (or a 3.3 V) regulated supply.

The circuit may be adapted so that its retriggering signal is an input to a burglar warning device, The circuit may be adapted to serve during charging of a battery, perhaps as an alternator control and/or a voltage regulator.

For example, determination that only a small charge remains may cause the initiation of an automatic charging process such as the unfurling of blades of a wind-driven generator or exposure of a solar panel to the sun.

The circuit may switch various banks of accessories off at separate points along a discharge curve using separate solid-state switches rather than the single switch (or paralleled array) as illustrated herein.

Preferred display devices for fullness of charge include face or edge-viewed moving-needle meters, bar-graph LED displays, audible displays (e.g. using speech synthesis) numerical displays, liquid-crystal displays, or head-up displays, and may show remaining charge as such or as a percentage of full charge, or may with further computation indicate "estimated remaining mileage possible" or "estimated talk time remaining" possibly taking into account recent loading or mileage per charge unit Advantages None of the prior art appears to teach a procedure for accurately assessing battery charge condition and actually disconnecting a battery from a load in order to conserve at least some charge for a critical application, and automatically reconnecting the battery on sensing an imminent desire for use. (A typical scenario is the car which has been left for a period with some accessories running; the user would like to be able to start its engine on returning to the car.)

Finally, it will be appreciated that various alterations and modifications may be made to the foregoing without departing from the scope of this invention as set forth in the claims.

I claim:

1. A battery monitoring system for connection to an automotive battery between a battery terminal and a non-critical load, the battery monitoring system comprising:

voltage means for measuring the voltage of the automotive battery;

load sensing means for measuring the current passing out of the battery to the non-critical load;

evaluation means for determining the state of charge of the battery based on the relationship between measured voltage and measured current to the non-critical load; and at least one switching means for connecting and disconnecting at least part of the non-critical load from the battery, the load sensing means being capable of, (i) controlling the at least one switching means to disconnect the non-critical load if the stored charge in the battery drops below a pre-determined value, (ii) monitoring the size of the non-critical electrical load connected to the battery, and (iii) causing the at least one switching means to at least temporarily reconnect the non-critical load to the battery if a change in the size of the non-critical load is detected by the load sensing means.

2. The battery monitoring system as claimed in claim 1, wherein the evaluation means is capable of comparing (a) the measured voltage and measured current to the non-critical load, with (b) stored values of the relationship between measured voltage, measured current and the state of charge of automotive batteries of a type that includes the automotive battery.

3. The battery monitoring system as claimed in claim 1, wherein the predetermined value is the greater of (a) 50% of maximum state of charge for automotive batteries of a type that includes the automotive battery or (b) a remaining charge of about 20 Ampere-hours.

4. The battery monitoring system as claimed in claim 1, wherein the stored values for automotive batteries of a type that includes the automotive battery comprise a set of parameters suitable for use in an analog computer.

5. The battery monitoring system as claimed in claim 1, wherein the stored values for automotive batteries of a type that includes the automotive battery comprise a set of constants for use in an algorithm capable of predicting the state of charge of that type of automotive battery given voltage and current measurements.

6. The battery monitoring system as claimed in claim 2, wherein the stored values comprise at least one array of constants held within an addressable table, each constant representing the state of charge of a defined type of automotive battery, on obtaining at least a voltage measurement and a current measurement.

7. The battery monitoring system as claimed in claim 2, further comprising means for measuring the ambient temperature and providing an output capable of representing the ambient temperature and for modifying the evaluation process so that a greater reserve of charge is retained during colder weather.

8. A vehicle having an automotive battery connected to (a) a critical load and (b) a non-critical load, and the battery monitoring system as claimed in claim 1 connected between a battery terminal and the non-critical load, wherein the battery monitoring system is capable of conserving at least some charge in the automotive battery so that the critical load can be supplied using the at least some conserved charge, and further comprising delay means for delaying the operation of the at least one switching means from disconnecting the non-critical load again after reconnection to enable the operation of at least an ignition switch of the vehicle.

9. The vehicle having an automotive battery connected to a load, as claimed in claim 8, wherein the predetermined value is 50% of maximum state of charge for automotive batteries of a type that includes the automotive battery.

10. An automotive battery having the battery monitoring system as claimed in claim 1 built into the automotive battery, the automotive battery having at least one positive and one negative terminal, the monitoring means allowing the battery to disconnect itself from a non-critical load in the event of the evaluation means within the battery monitoring means determining that the state of charge remaining in the battery has decreased below a predetermined level.

* * * * *